(12) United States Patent  (10) Patent No.: US 8,889,434 B2
Tsen et al.  (45) Date of Patent: Nov. 18, 2014

(54) SCANNER OVERLAY CORRECTION SYSTEM AND METHOD

(71) Applicant: Taiwan Semiconductor Manufacturing Co., Ltd., Hsin-Chu (TW)

(72) Inventors: Yen-Di Tsen, Chung-Ho (TW); Shin-Rung Lu, Chu-Pei (TW); Jong-I Mou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 30 days.

(21) Appl. No.: 13/716,340

(22) Filed: Dec. 17, 2012

(65) Prior Publication Data

US 2014/0170782 A1  Jun. 19, 2014

(51) Int. Cl.
 *H01L 21/00* (2006.01)
 *H01L 21/66* (2006.01)

(52) U.S. Cl.
 CPC ..................................... *H01L 22/12* (2013.01)
 USPC ................................................. 438/7; 438/16

(58) Field of Classification Search
 USPC .................................................. 438/5–13, 16
 See application file for complete search history.

(56) References Cited

U.S. PATENT DOCUMENTS

| 7,704,652 B2 * | 4/2010 | Hatai | 430/22 |
| 7,842,442 B2 | 11/2010 | Seltmann et al. | |
| 8,175,831 B2 * | 5/2012 | Izikson et al. | 702/83 |
| 2005/0071033 A1 | 3/2005 | Cheng et al. | |
| 2007/0064211 A1 * | 3/2007 | Hatai | 355/55 |
| 2012/0022679 A1 | 1/2012 | Choi et al. | |

OTHER PUBLICATIONS

Conway, T. H. et al., "Improving overlay control through proper use of multilevel query APC", Proc. SPIE 5044, Advanced Process Control and Automation, Jun. 2003, 8 pages.
Conway, T. and Crow, D., "Controllability and Performance of Feedback Control System for Overlay," A A 1.2 (2002): 16, 4 pages.
Solid State Technology, Insights for Electronics Manufacturing, WaferSense APS, "Capabilities and Lessons from 10 Years of APC Success", retrieved from http://www.electroiq.com/articles/sst/print/volumne-47/issue-2/features/advanced-process . . . , Oct. 2012.

* cited by examiner

*Primary Examiner* — Richard Booth
(74) *Attorney, Agent, or Firm* — Duane Morris LLP; Steven E. Koffs

(57) ABSTRACT

A method includes performing a semiconductor fabrication process on a plurality of substrates. The plurality of substrates are divided into a first subset and a second subset. A rework process is performed on the second subset of the plurality of substrates but not on the first subset. A respective mean value of at least one exposure parameter for a lithography process is computed for each respective one of the first and second subsets of the plurality of substrates. A scanner overlay correction and a mean correction are applied to expose a second plurality of substrates on which the rework process has been performed. The mean correction is based on the computed mean values.

12 Claims, 7 Drawing Sheets

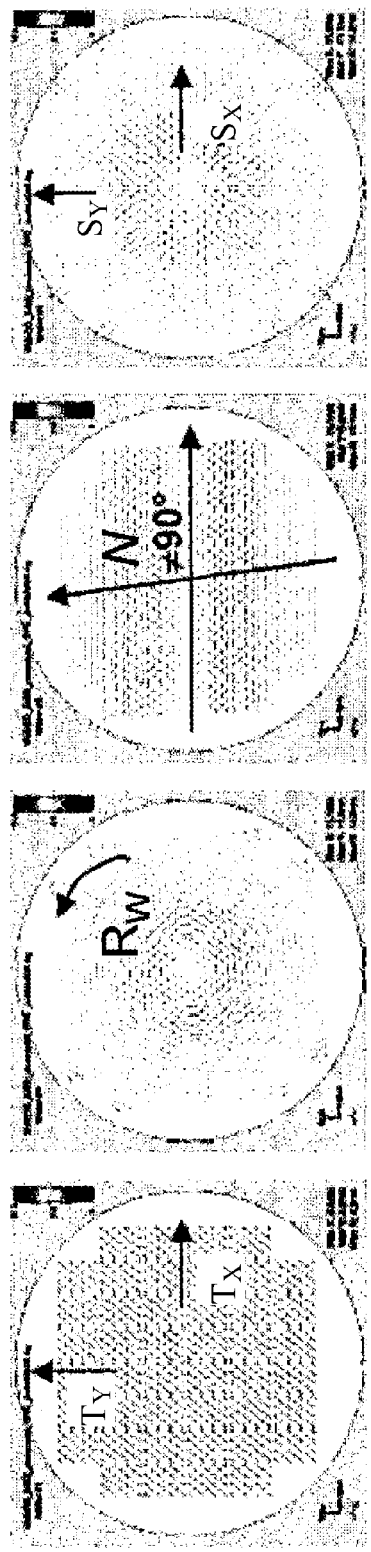

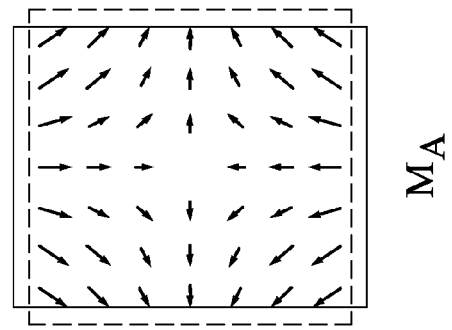
FIG. 2H  $M_A$
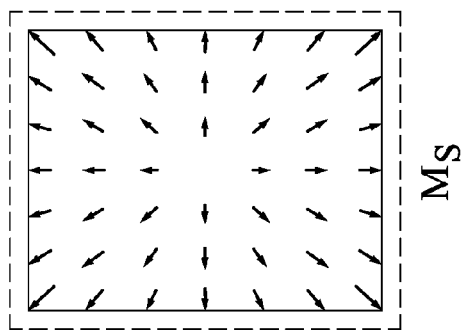
FIG. 2G  $M_S$
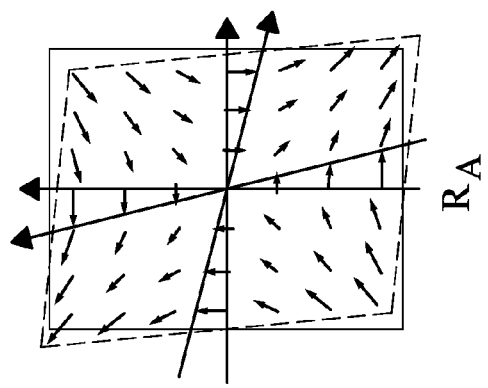
FIG. 2F  $R_A$
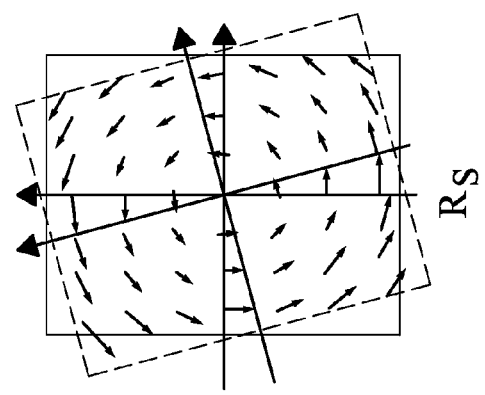
FIG. 2E  $R_S$

SCANNER OVERLAY CORRECTION SYSTEM AND METHOD

FIELD

This disclosure relates generally to semiconductor processing and more specifically to scanner equipment used in photolithography.

BACKGROUND

Lithography is widely used in integrated circuit (IC) fabrication. A material layer is deposited on a wafer. A masking material is formed over the material layer and exposed in a pattern to form a hard mask for etching. Portions of the material layer which are not covered by the mask are then etched to form one or more patterns (e.g., trenches) that are filled with conductive material (e.g., copper) and planarized to form circuit paths. Another material layer is deposited over the patterned first material layer and the process is repeated to pattern the second layer. This process is repeated many times.

To ensure proper connectivity and performance, the patterns in adjacent layers are aligned properly with each other. Alignment marks (e.g., boxes) are used to align each added layer to the previously formed layer.

To maintain proper alignment between layers, a form of run-to-run control referred to as advance process control (APC) is used. Alignment errors are monitored. From time to time, an operator inputs a correction (e.g., a translation, rotation or scaling correction) to the scanning exposure tool, perhaps weekly or monthly. This correction is applied to compensate for the condition causing the misalignment.

BRIEF DESCRIPTION OF THE DRAWINGS

FIGS. 2A-2D are diagrams showing the parameters of an exemplary inter-field overlay model.

FIGS. 2E-2H are diagrams showing the parameters of an exemplary intra-field overlay model.

DETAILED DESCRIPTION

This description of the exemplary embodiments is intended to be read in connection with the accompanying drawings, which are to be considered part of the entire written description.

Figure 1:
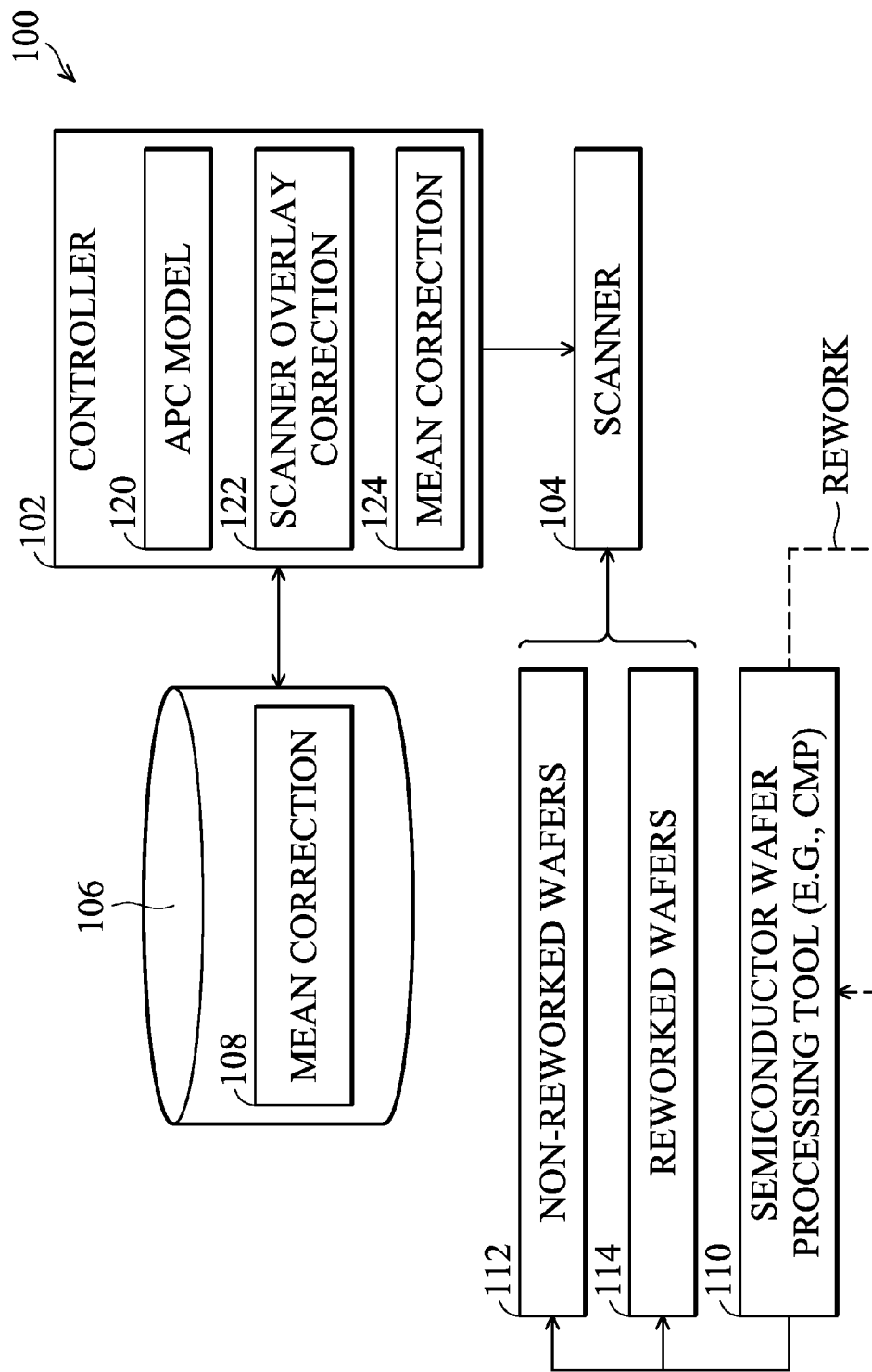
FIG. 1 is a block diagram of a system for controlling a scanner.

FIG. 1 is a schematic block diagram of an example of a system 100. A photo tool 104 is provided for performing photolithographic exposure. In some embodiments, the photo tool 104 is a stepper. A stepper passes light through a mask or reticle, forming an image of the reticle pattern. The image is focused and reduced by a lens, and projected onto the surface of a semiconductor substrate that is coated with a photoresist. The stepper translates or "steps" the wafer from one field or shot location to another, by moving the wafer back and forth under the lens of the stepper.

In some embodiments, the photo tool 104 is a scanner. Scanners are steppers that move the reticle stage and wafer stage in opposite directions relative to each other during the exposure. Instead of exposing the entire field at once, the exposure is made through an aperture that is as wide as the exposure field, but only a fraction of its length. The image from the aperture is scanned across the exposure area. Although reference is made below to an example of a scanner, the techniques described below with reference to scanner 104 can also be applied to other types of steppers.

A controller 102 controls operation of the scanner. The controller 102 includes an advanced process control (APC) model 120, a scanner overlay correction module 122 and a mean correction module 124. In some embodiments, the controller 102 comprises a general purpose processor programmed to perform the computations described herein. The general purpose processor can be a computer or an embedded processor or microcontroller. In some embodiments, the controller comprises application specific integrated circuitry (ASIC) for performing the functions described herein.

The controller 102 has read and write access to a non-transitory, machine readable storage medium 106 which has been encoded to store one or more mean correction values to be used for applying respective offset(s) to one or more exposure parameters used by the scanner 104.

In some embodiments, the controller contains a scanner overlay correction module 122 corresponding to the scanner. The scanner overlay correction module includes an adjustment for wafer rotation, an adjustment for wafer non-orthogonality and an adjustment for wafer scaling coefficients. In other embodiments, other exposure parameters are used, such as one or more of the group consisting of wafer rotation, wafer non-orthogonality and wafer scaling coefficients.

The mean correction module 124 of controller 102 is configured to determine whether a semiconductor substrate to be exposed by a scanner has been subjected to a specific process or step, such as a rework process. In some embodiments, the mean correction module 124 identifies substrates as belonging to either a first group 112 that has undergone a first set of fabrication processes, or a second group 114 that has undergone a second set of fabrication processes differing in some respect from the first set of fabrication processes.

A non-transitory, machine readable storage medium 108 contains a mean correction value to be applied to the scanner for exposing the semiconductor substrate if the semiconductor substrate has been subjected to the rework process. The mean correction module 124 applies the mean correction value(s) 108 when controlling the scanner 104 to expose the substrates in the second group 114, but not when controlling the scanner 104 to expose the substrates in the first group 112.

The system further comprises one or more semiconductor fabrication tools 110, such as a CMP tool. The tool(s) 110 provide a first plurality of wafers belonging to the first group 112 and a second plurality of wafers belonging to the second group 114. For example, in some embodiments, the tool 110 is a CMP tool. Wafers in the first group 112 are planarized by the tool 110 and pass inspection without undergoing rework. Wafers in the second group 114 do not immediately pass all acceptance criteria, and are thus subjected to a CMP rework process.

The mean correction module 124 of controller 102 is configured to control the scanner 104 using a scanner overlay correction. The controller is further configured to apply the mean correction value to adjust an exposure parameter of the scanner if the semiconductor substrate to be exposed by the scanner has been subjected to the rework process. The controller is configured to control the scanner to expose substrates, on which the rework process has not been performed, without using the mean correction.

In some embodiments, the mean correction module 124 of the controller 102 is configured to compute the mean correction as a difference between: a mean of the exposure parameter among a first plurality of substrates that have been processed by the semiconductor fabrication process and the rework process, and a mean of the exposure parameter among a second plurality of substrates that have been processed by the semiconductor fabrication process but not the rework process.

The inventors have determined that subjecting a substrate to a rework process can physically alter a characteristic (e.g., thickness) of the substrate which is relevant to the APC model. Thus, in some embodiments, the controller 102 controls the scanner 104 to apply an additional correction to the second group of substrates 114. In some embodiments, this correction is uniformly applied as a constant adjustment across all the substrates in the second group 114. This additional correction is not applied to the substrates in the first group 112.

In some embodiments, the semiconductor fabrication process is a chemical mechanical polishing (CMP) process performed on a layer of one of the first plurality of substrates, and the rework process is a CMP rework process performed on the same layer of the one substrate. In some embodiments, the exposure parameter includes: a first wafer scaling coefficient $S_X$ for a first direction; and a second wafer scaling coefficient $S_Y$ for a second direction orthogonal to the first direction.

Each scanner has an APC model 120, which can be defined by the manufacturer of the scanner. FIGS. 2A to 2H show a plurality of conditions that are included in the APC model 120 in some embodiments.

FIGS. 2A-2D show factors in the inter-field model. These factors are uniformly applied within a field, and result in a deviation between a location in one field and the corresponding location in an adjacent field. FIG. 2A shows inter-field X and Y direction translations $T_X$ and $T_Y$, respectively. FIG. 2B shows inter-field wafer rotation $R_W$. FIG. 2C shows non-orthogonality (whereby a right angle in one field is transformed into an acute or obtuse angle in another field) FIG. 2D shows scaling coefficients $S_X$ and $S_Y$, respectively (which result in one field or shot being elongated or compressed in X and/or Y directions relative to an adjacent field or shot).

In some embodiments, the Inter-field Model is given by:

$$d_x = T_X - (R_W + N)*Y + S_x*X + \text{higher order terms} \quad (1)$$

$$d_y = T_Y + R_w*X + S_Y*Y + \text{higher order terms} \quad (2)$$

wherein
(X,Y) are inter-field coordinate system, with respect to the center of the wafer,
$d_x$, $d_y$ are inter-field overlay errors,
$T_X$, $T_Y$ are inter-field translations,
$R_W$ is wafer rotation,
N is non-orthogonality and
$S_X$, $S_Y$ are wafer scaling coefficients, and
The higher order terms can be ignored.

FIGS. 2E-2H show factors in the intra-field model. FIG. 2E shows a symmetric rotation. FIG. 2F shows an asymmetric rotation. FIG. 2G shows a symmetrical magnification. FIG. 2H shows an asymmetrical magnification.

In some embodiments, the intra-field model is given by:

$$d_x = T_x - (R_S + R_A)*y + (M_S + M_A)*x + \text{higher order terms} \quad (3)$$

$$d_y = T_Y + (R_S - R_A)*x + (M_S - M_A)*y + \text{higher order terms} \quad (4)$$

where:
(x,y) is the intra-field coordinate system, with respect to the center of a field,
$d_x$, $d_y$ are intra-field overlay errors,
$T_x$, $T_y$ are intra-field translations,
$R_S$, $R_A$ are symmetrical and asymmetrical field rotations, and
$M_S$, $M_A$ are symmetrical and asymmetrical field magnifications.

Figure 3:
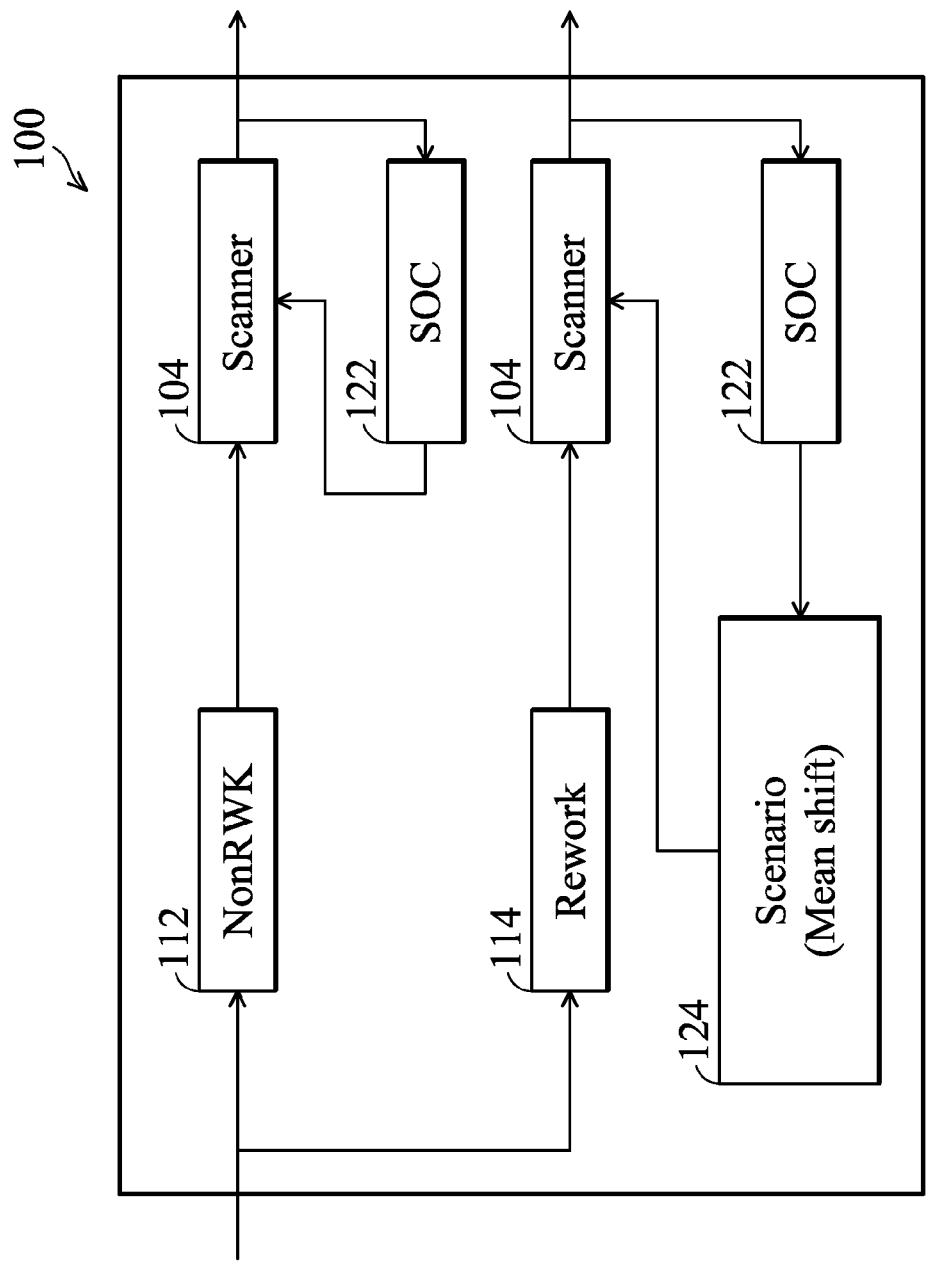
FIG. 3 is a schematic diagram of the APC controller of FIG. 1

FIG. 3 is a schematic functional diagram of the control apparatus 100.

Wafers 112 in the first processing group (e.g., wafers which have not undergone a CMP rework process) are exposed in the scanner 104 using scanner overlay correction 122.

Wafers 114 in the second processing group (e.g., wafers which have undergone a CMP rework process) are also exposed in the scanner 104 using scanner overlay correction 122. However, an additional adjustment is made to the scanner to compensate for the effect of the rework.

Although FIG. 3 conceptually shows separate processing of the first group 112 and second group 114 of substrates, both groups can be processed in the same scanner 104. In some embodiments, all of the first group 112 of substrates are exposed in a first batch, and then all of the second group 114 of substrates are exposed in a second batch. In other embodiments, the two groups 112 and 114 of substrates can be intermingled.

Figure 5:
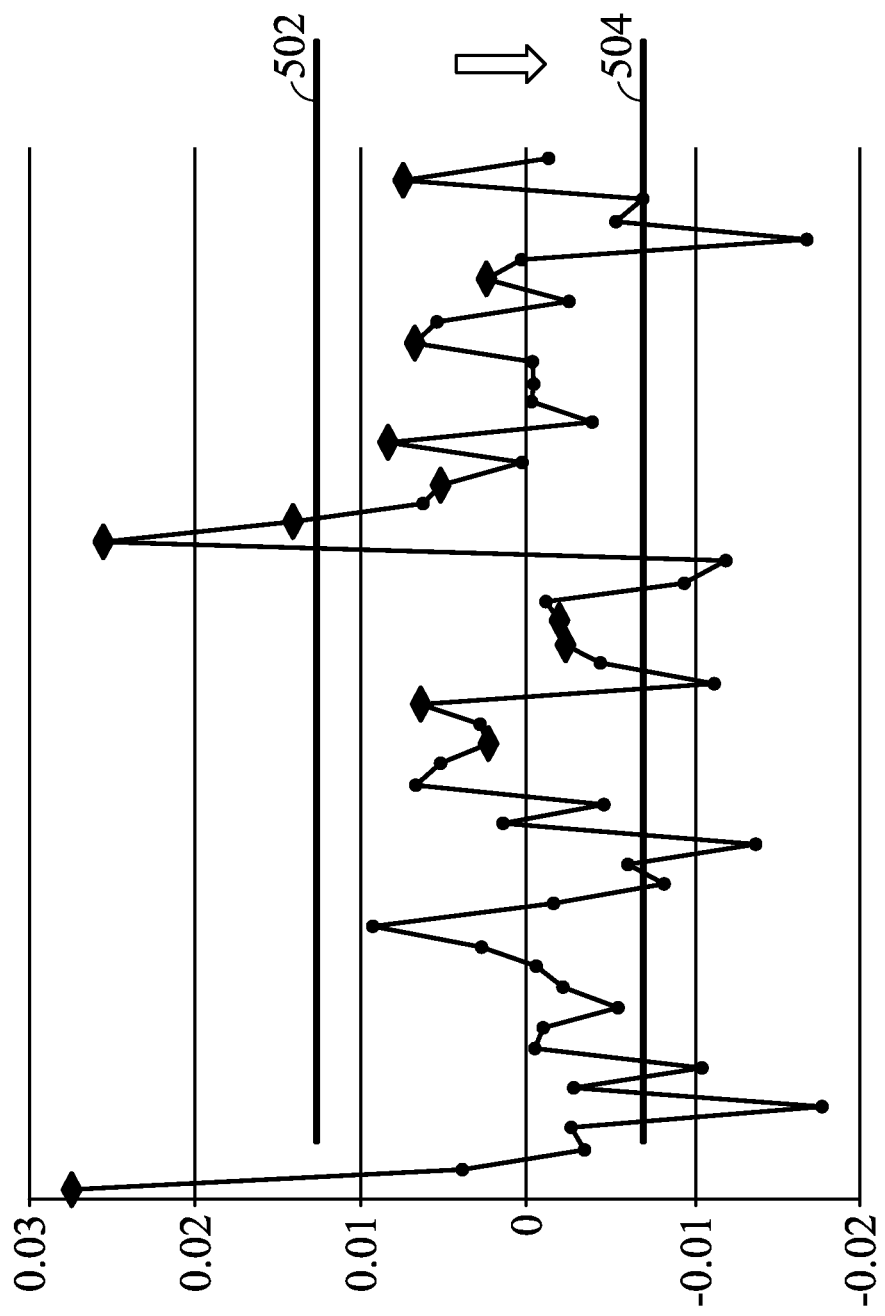
FIG. 5 is a diagram of overlay error data without a mean correction.
Figure 6:
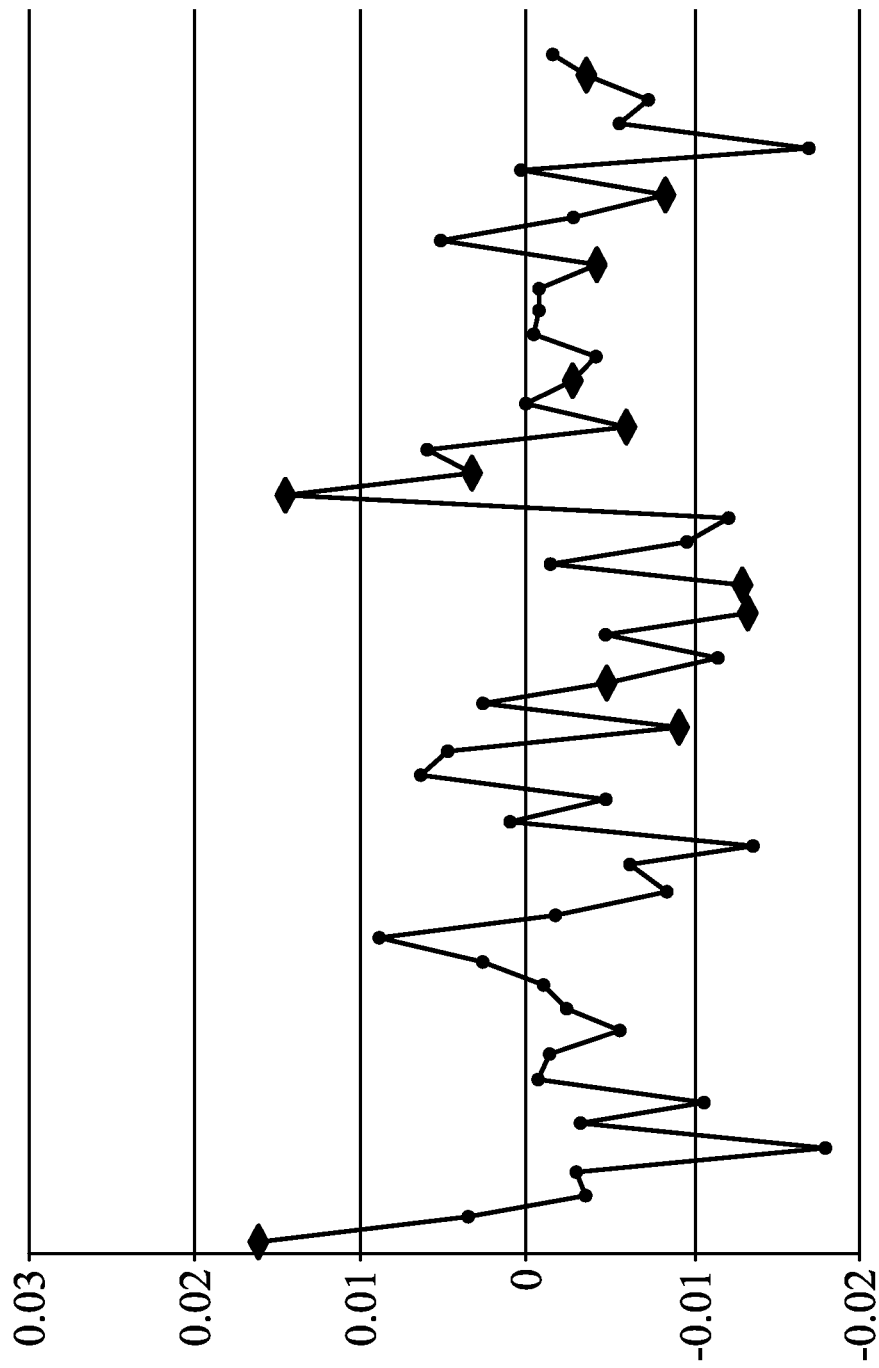
FIG. 6 is a diagram of overlay error data with a mean correction for reworked wafers.

FIGS. 5 and 6 show an example of the impact of the mean correction. In both FIG. 5 and FIG. 6, the Y (vertical) axis represents the overlay error, and the various X (horizontal) axis locations represent different data points corresponding to wafers processed in time sequence. In this example, the overlay error (Y axis) corresponds to error in Sx, the wafer scaling coefficient in the X direction.

In FIG. 5, the values of one of the above listed exposure parameters for the first group 112 of wafers is represented by circles, and corresponding values for the second group 114 of wafers is represented by diamonds. The mean 502 of the overlay errors for the second (reworked) group is substantially greater than the mean 504 of the overlay errors for the first (non-reworked) group.

In some embodiments, for a CMP rework operation, the deviations in the overlay error correspond to a shift in the mean wafer scaling coefficients $S_X$, $S_Y$. Thus, in controlling the operation of the scanner 104, the values of $S_X$ and $S_Y$ are adjusted by the mean value observed among reworked wafers during the previous rework operations, so as to compensate for the rework-effect when exposing a new plurality of reworked wafers 114 in the scanner 104.

In FIG. 6, a mean shift (corresponding to the difference in the means of an exposure parameter between the non-reworked and reworked substrates) is added to the scanner overlay correction model for the reworked substrates. For example, in some embodiments, a mean shift is added to the $S_X$ and $S_Y$ terms of equations (1) and (2), above for each of the reworked wafers. As a result, the difference in overlay error between the non-reworked and pre-processed (e.g., reworked) substrates is effectively eliminated.

In other embodiments, for which the model of equations (1) to (4) apply, other combinations of one or more of the parameters $T_X$, $T_Y$, $R_W$, N, $S_X$ and $S_Y$ of the inter-field model or $T_x$, $T_y$, $R_S$, $R_A$, $M_S$, and $M_A$ of the intra-field model are adjusted according to respective differences between the respective means of the non-reworked wafers and the means of the reworked wafers. In other embodiments, the scanner 104 operates according to different scanner overlay control error models, and an appropriate mean shift is implemented.

Although an example above assigns substrates to groups according to whether or not the wafer has undergone CMP rework, the method can be applied for other groupings. For example, in some embodiments, the first group of substrates have not undergone photo rework, and the second group of substrates have undergone photo rework. In other embodiments, the first group and second group differ from each other with respect to whether a processing step (other than rework) is performed prior to exposing the substrate in the scanner 104.

Figure 4:
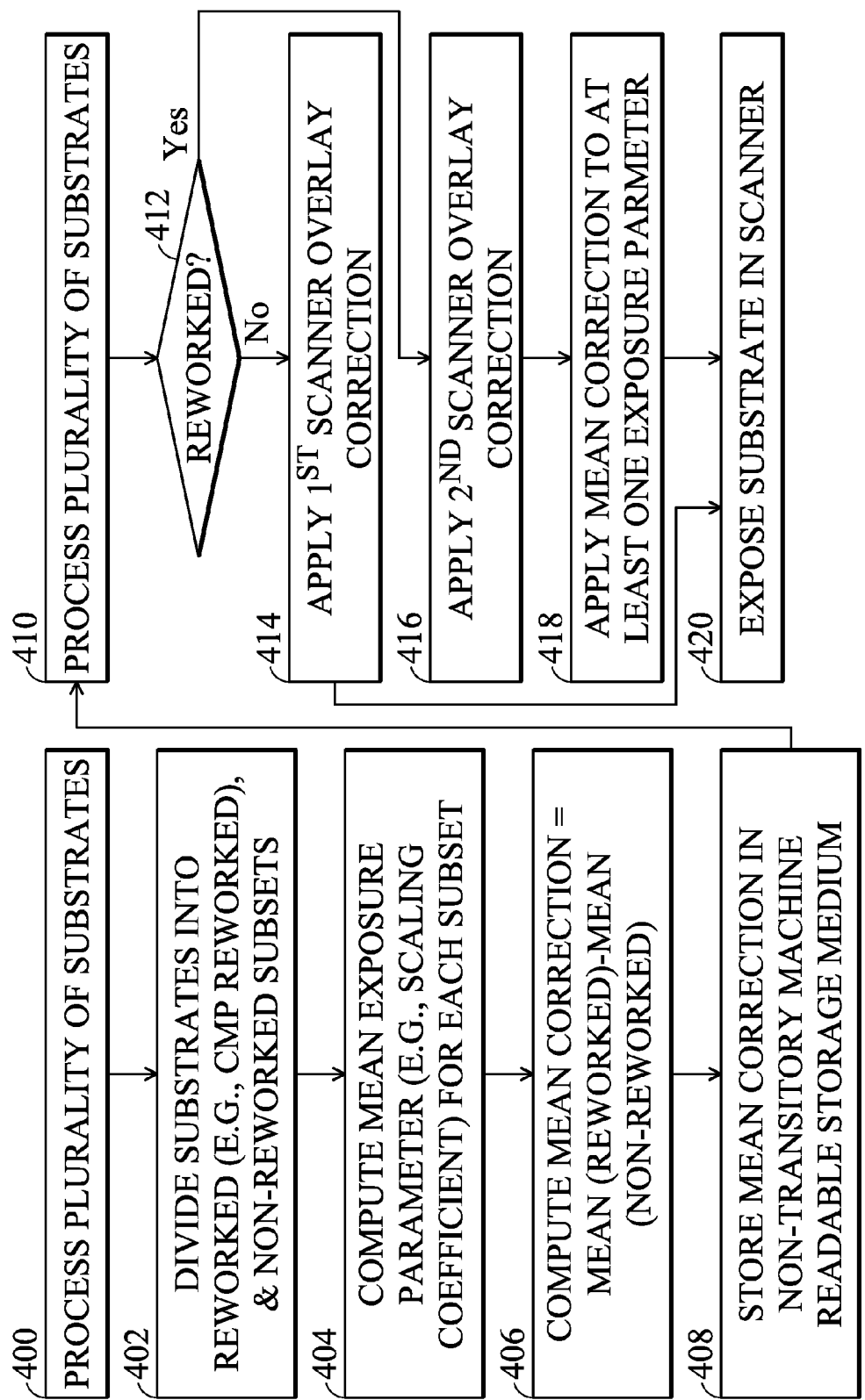
FIG. 4 is a flow chart of a method for controlling the scanner of FIG. 1.

FIG. 4 is a flow chart of an exemplary process.

In step 400, a plurality of semiconductor substrates that have been processed by a semiconductor fabrication process are provided for exposure by a stepper, such as a scanner.

At step 402, the substrates are divided or assigned according to whether the substrates have received special processing. For example, in some embodiments, the substrates are divided into a group that has been reworked (e.g., CMP rework or photo rework), and a group that has not been reworked. The non-reworked substrates are assigned to a first plurality of semiconductor substrates that have not been processed by the semiconductor fabrication process and a rework process. The reworked substrates are assigned to a second plurality of semiconductor substrates that have been processed by the semiconductor fabrication process and a rework process.

At step 404, a respective mean exposure parameter (e.g., a scaling coefficient $S_X$, $S_Y$) is computed for each individual one of the first and second subsets.

At step 406, a mean correction value 108 is computed for each of the exposure parameters that is substantially affected by the differential processing. For example, in some embodiments where the second group of substrates is subjected to an additional step or process that changes a thickness of a layer of the substrate, the scaling coefficients $S_X$, $S_Y$ are affected. Thus, an X mean shift is computed by subtracting the mean $S_X$ of the substrates in the second group from the mean $S_X$ in the first group. Similarly, the Y mean shift is computed by subtracting the mean $S_Y$ of the substrates in the second group from the mean $S_Y$ in the first group. This is just one example. If the first and second groups differ by a different process or step (other than CMP rework) that affects the second group but not the first, then the mean shift of one or more different parameters of the model are computed.

At step 408, the mean correction value(s) 108 is (are) stored in a non-transitory, machine readable storage medium, for subsequent use. In some embodiments, this stored value 108 is automatically forwarded to the controller 100. In other embodiments, a user reads the correction value 108 from the medium 106 and manually enters the value 108 in the controller.

At step 410, a plurality of substrates are processed by a process or step that is performed prior to an exposure step on the scanner 104. In some embodiments, this is the same set of substrates processed in step 400 (and used to compute the mean correction in step 406), but the correction is to be applied to a different layer than the layer processed in step 400. In some embodiments, the substrates processed in step 410 are not the same substrates processed in step 400, but the exposure process in the scanner is controlled using the mean correction computed in step 406 (based on the empirical data fed back from the processing in step 400). For example, the additional wafers can include a third plurality of substrates, on which a rework process has not been performed, and a fourth plurality of substrates, on which a rework process has been performed.

At step 412, a determination is made whether the substrate to be processed is reworked or not reworked. In some embodiments, this determination is made on a group by group basis. In other embodiments, this determination is made on an individual substrate basis. If the substrate(s) to be processed are not reworked, step 414 is performed next. If the substrate(s) to be processed are reworked, step 416 is performed next.

At step 414, a first scanner overlay correction is applied to the scanner for exposing the first plurality of (non-reworked) substrates. Then step 420 is performed next.

At step 416, a second scanner overlay correction is applied to the scanner for exposing the second plurality of (reworked) substrates. In some embodiments, the first and second scanner overlay corrections are the same as each other.

At step 418, the mean correction value 108 stored in the storage medium 106 is applied to the scanner for exposing the second plurality of substrates.

At step 420, the scanner exposes the substrate(s) using the applied settings. Thus, for example, a new (third) plurality of substrates, on which the rework process has not been performed, can be exposed, without using the mean correction 108. Meanwhile, a new (fourth) plurality of substrates, on which the rework process has been performed, can be exposed, using the mean correction 108.

As described herein, the pre-processing effects of rework, film thickness, range and out-of-specification values can be eliminated by the combination of overlay APC with scanner overlay correction and mean shift correction. When the mean shift is added to the overlay APC for reworked substrates, these pre-processing effects are reduced or eliminated. Based on simulations, the standard deviation of overlay errors can be reduced by about 14 to 18% by using the mean correction for reworked substrates.

In some embodiments, a method comprises: (a) providing a first plurality of semiconductor substrates that have been processed by a semiconductor fabrication process; (b) providing a second plurality of semiconductor substrates that have been processed by the semiconductor fabrication process and a rework process; (c) applying a first scanner overlay correction to expose the first plurality of substrates; and (d) applying a second scanner overlay correction and a mean correction to expose the second plurality of substrates.

In some embodiments, a method comprises: (a) performing a semiconductor fabrication process on a plurality of substrates; (b) after step (a), dividing the plurality of substrates into a first subset and a second subset; (c) performing a rework process on the second subset of the plurality of substrates but not on the first subset; (d) computing a respective mean value of at least one exposure parameter for a lithography process for each respective one of the first and second subsets of the plurality of substrates; and (e) applying a scanner overlay correction and a mean correction to expose a second plurality of substrates on which the rework process has been performed, the mean correction being based on the mean values from step (d).

In some embodiments, control apparatus comprises: a controller configured to determine whether a semiconductor substrate to be exposed by a scanner has been subjected to a rework process. A non-transitory, machine readable storage medium contains a mean correction value to be applied to the scanner for exposing the semiconductor substrate if the semiconductor substrate has been subjected to the rework process. The controller is configured to control the scanner using a scanner overlay correction. The controller is further configured to apply the mean correction value to adjust an exposure parameter of the scanner if the semiconductor substrate to be exposed by the scanner has been subjected to the rework process.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
   (a) providing a first plurality of semiconductor substrates that have been processed by a semiconductor fabrication process;
   (b) providing a second plurality of semiconductor substrates that have been processed by the semiconductor fabrication process and a rework process;
   (c) applying a first scanner overlay correction to expose the first plurality of substrates; and
   (d) applying a second scanner overlay correction and a mean correction to expose the second plurality of substrates.

2. The method of claim 1, further comprising, prior to step (d), computing the mean correction as a difference between:
   a mean of an exposure parameter value among a third plurality of substrates that have been processed by the semiconductor fabrication process and the rework process, and
   a mean of the exposure parameter value among a fourth plurality of substrates that have been processed by the semiconductor fabrication process but not the rework process.

3. The method of claim 2, wherein the at least one exposure parameter includes:
   a first wafer scaling coefficient for a first direction; and
   a second wafer scaling coefficient for a second direction orthogonal to the first direction.

4. The method of claim 1, wherein the semiconductor fabrication process is a chemical mechanical polishing (CMP) process performed on a layer of one of the second plurality of substrates, and the rework process is a CMP rework process performed on the same layer of the one substrate.

5. A method comprising:
   (a) performing a semiconductor fabrication process on a plurality of substrates;
   (b) after step (a), dividing the plurality of substrates into a first subset and a second subset;
   (c) performing a rework process on the second subset of the plurality of substrates but not on the first subset;
   (d) computing a respective mean value of at least one exposure parameter for a lithography process for each respective one of the first and second subsets of the plurality of substrates; and
   (e) applying a scanner overlay correction and a mean correction to expose a second plurality of substrates on which the rework process has been performed, the mean correction being based on the mean values from step (d).

6. The method of claim 5, further comprising:
   (f) exposing a third plurality of substrates, on which the rework process has not been performed, wherein the third plurality of substrates is exposed without using the mean correction of step (e).

7. The method of claim 5, wherein the semiconductor fabrication process is a chemical mechanical polishing (CMP) process performed on a layer of the substrate, and the rework process is a CMP rework process performed on the same layer of the substrate.

8. The method of claim 7, wherein the at least one exposure parameter includes:
   a first wafer scaling coefficient for a first direction; and
   a second wafer scaling coefficient for a second direction orthogonal to the first direction.

9. The method of claim 5, wherein the lithography process comprises:
   exposing each respective one of the first and second subsets of the plurality of substrates using a scanner between steps (c) and (d).

10. The method of claim 9, further comprising:
    applying a non-rework scanner overlay correction to the scanner after exposing the first subset of the plurality of substrates, to be used for exposing a third plurality of substrates, on which the rework process has not been performed,
    wherein the scanner overlay correction of step (e) is applied to the scanner after exposing the second subset of the plurality of substrates, to be used for exposing the second plurality of substrates.

11. The method of claim 5, wherein the mean correction is calculated as the difference between the mean values computed in step (d).

12. The method of claim 5, wherein:
    the semiconductor fabrication process is a chemical mechanical polishing (CMP) process performed on a layer of the substrate, and the rework process is a CMP rework process performed on the same layer of the substrate;
    the lithography process comprises exposing each respective one of the first and second subsets of the plurality of substrates using a scanner between steps (c) and (d);
    the mean correction is calculated as the difference between the mean values computed in step (d); and
    the method further comprises:
    applying a first scanner overlay correction to the scanner after exposing the first subset of the plurality of substrates, to be used for exposing a third plurality of substrates, on which the rework process has not been performed, wherein the scanner overlay correction of step (e) is applied to the scanner after exposing the second subset of the plurality of substrates, to be used for exposing the second plurality of substrates;

exposing the third plurality of substrates without using the mean correction of step (e), wherein the at least one exposure parameter includes:
  a first wafer scaling coefficient for a first direction; and
  a second wafer scaling coefficient for a second direction orthogonal to the first direction.

* * * * *